(12) United States Patent
Chang et al.

(10) Patent No.: US 12,384,673 B2
(45) Date of Patent: Aug. 12, 2025

(54) METHOD FOR MANUFACTURING MEMS DEVICE AND MEMS DEVICE

(71) Applicant: AAC ACOUSTIC TECHNOLOGIES (SHENZHEN) CO., LTD., Shenzhen (CN)

(72) Inventors: Ping-He Chang, Hsinchu (CN); Kahkeen Lai, Singapore (SG)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 406 days.

(21) Appl. No.: 18/073,472

(22) Filed: Dec. 1, 2022

(65) Prior Publication Data

US 2024/0051819 A1  Feb. 15, 2024

Related U.S. Application Data

(63) Continuation of application No. PCT/CN2022/121224, filed on Sep. 26, 2022.

(30) Foreign Application Priority Data

Aug. 15, 2022 (CN) .......................... 202210973004.2

(51) Int. Cl.
  *B81C 1/00* (2006.01)

(52) U.S. Cl.
  CPC .. *B81C 1/00476* (2013.01); *B81C 2201/0105* (2013.01); *B81C 2201/0132* (2013.01); *B81C 2201/0133* (2013.01); *B81C 2203/0172* (2013.01)

(58) Field of Classification Search
  None
  See application file for complete search history.

(56) References Cited

U.S. PATENT DOCUMENTS

| 9,772,245 B2 * | 9/2017 | Besling ................. G01L 9/0045 |
| 2006/0166393 A1 * | 7/2006 | Ha ......................... B81C 1/0092 |
| | | 438/53 |

(Continued)

OTHER PUBLICATIONS

Man et. al. in "Microfluidic Plastic Interconnects For Multibioanalysis Chip Modules" ( Proc. SPIE 3224, Micromachined Devices and Components III, (Sep. 5, 1997); https://doi.org/10.1117/12.284516) (Year: 1997).*

*Primary Examiner* — Allan W. Olsen
(74) *Attorney, Agent, or Firm* — Wiersch Law Group

(57) ABSTRACT

A method for manufacturing a MEMS device and the MEMS device are provided. The method includes: depositing a film on at least a part of a surface of a sacrificial layer, defining at least one through hole in the thin film by machining, removing at least a part of a material covered by the thin film in the sacrificial layer, discharging the part of the material removed from the sacrificial layer from the at least one through hole to define a cavity in the sacrificial layer, and depositing a sealing layer on a surface of the thin film facing away from the sacrificial layer to seal the at least one through hole. Compared with the manufacturing method in the related art, the manufacturing method of the disclosure only requires to deposit one layer of thin film, shorten the production period, and has reliable on-site sealing capability.

7 Claims, 5 Drawing Sheets

(56) References Cited

U.S. PATENT DOCUMENTS

| | | | |
|---|---|---|---|
| 2009/0188709 A1* | 7/2009 | Kojima | B81C 1/00476 427/58 |
| 2011/0031567 A1* | 2/2011 | Corona | B81C 1/00047 257/419 |
| 2011/0210435 A1* | 9/2011 | Verheijden | B81C 1/00333 257/684 |

* cited by examiner

METHOD FOR MANUFACTURING MEMS DEVICE AND MEMS DEVICE

CROSS REFERENCE TO RELATED APPLICATIONS

The present application is a continuation of PCT Patent Application No. PCT/CN2022/121224, filed Sep. 26, 2022, which claims priority to Chinese patent application No. 202210973004.2, filed Aug. 15, 2022, each of which is incorporated by reference herein in its entirety.

TECHNICAL FIELD

The disclosure relates in general to the field of sealing technologies, and more particularly to a method for manufacturing a micro-electro-mechanical system (MEMS) device and a MEMS device.

BACKGROUND

In the related art, a sealing treatment method for an internal cavity of a device is that a thin film layer is deposited on a top of the cavity, and the thin film layer has air outlet holes defined by an etching process. After gas is discharged from the internal cavity of the device, the air outlet holes are sealed with a sticking film to realize sealing of a small cavity. However, this method requires specific silicon-based materials/tools, and a process period is relatively long. Although in some practical applications, sealing is realized by wafer bonding and film packaging, a manufacturing cost and maintenance are greatly increased, and even there are process/material limitations in the front end of the line (FEOL) based on complementary metal oxide semiconductor (CMOS).

SUMMARY

Embodiments of the disclosure provide a method for manufacturing a MEMS device and the MEMS device, which can shorten a production period.

According to a first aspect, embodiments of the disclosure provide a method for manufacturing a MEMS device. The method includes: depositing a thin film on at least a part of a surface of a sacrificial layer; defining at least one through hole in the thin film by machining; removing at least a part of a material covered by the thin film in the sacrificial layer, and discharging from the at least one through hole the part of the material removed from the sacrificial layer to define a cavity in the sacrificial layer; and depositing a sealing layer on a surface of the thin film facing away from the sacrificial layer to seal the at least one through hole.

Compared with the manufacturing method in the related art, the manufacturing method of the disclosure only needs to deposit a layer of thin film, shortens the production period, and has a reliable on-site sealing capability.

In some embodiments, before defining the at least one through hole in the thin film by machining, depositing a structural layer on at least another part of the surface of the sacrificial layer, wherein the structural layer has a hollow portion, and at least a part of the thin film is exposed through the hollow portion.

In some embodiments, the structural layer has a step structure, and an edge of the thin film is hold down by the step structure.

In some embodiments, after depositing the structural layer on at least the another part of the surface of the sacrificial layer, removing at least a part of a material covering the thin film in the structural layer to form the hollow portion.

In some embodiments, the thin film is made from one of a silicon-based material, a polymer material, or a metal material.

In some embodiments, the silicon-based material comprises silicon dioxide, silicon nitride, tetraethyl orthosilicate, polysilicon, or amorphous silicon.

In some embodiments, the at least one through hole is defined in the thin film by laser drilling or surface ablation.

In some embodiments, the method for manufacturing the MEMS device is completed in a vacuum environment.

In some embodiments, the structural layer is made from silicon oxide, metal oxide, or a material having a thermal expansion coefficient close to that of the silicon oxide.

In some embodiments, a thermal expansion coefficient of a material of the structural layer is close to a thermal expansion coefficient of a material of the thin film, or the thermal expansion coefficient of the material of the structural layer is close to a thermal expansion coefficient of a material of the sealing layer.

According to a second aspect, a MEMS device is provided. The MEMS device includes a sacrificial layer, a thin film, a structural layer, and a sealing layer. The sacrificial layer has a cavity. The thin film is disposed on a side of the sacrificial layer where the cavity is defined and covers the cavity, and the thin film defines at least one through hole communicating with the cavity. The structural layer is arranged on the side of the sacrificial layer where the cavity is defined. The sealing layer includes a first sealing portion, where the first sealing portion is disposed on a side of the thin film facing away from the sacrificial layer, and the first sealing portion closes the at least one through hole.

In some embodiments, the structural layer defines a hollow portion, and the hollow portion adjacent the side of the thin film facing away from the sacrificial layer, and the first sealing portion is filled in at least a part of a space of the hollow portion.

In some embodiments, the sealing layer further comprises a second sealing portion, the second sealing portion is disposed on a side of the structural layer away from the sacrificial layer, and the first sealing portion and the second portion part are connected through a connection portion, and the connection portion and the first sealing portion cooperatively form a recessed portion.

In some embodiments, a thickness of the structural layer is greater than a thickness of the thin film.

In some embodiments, the thin film is made from one of a silicon-based material, a polymer material, or a metal material.

In some embodiments, the silicon-based material comprises silicon dioxide, silicon nitride, tetraethyl orthosilicate, polysilicon, or amorphous silicon.

In some embodiments, the structural layer is made from silicon oxide, metal oxide, or a material having a thermal expansion coefficient close to that of the silicon oxide.

In some embodiments, a thermal expansion coefficient of a material of the structural layer is close to a thermal expansion coefficient of a material of the thin film, or the thermal expansion coefficient of the material of the structural layer is close to a thermal expansion coefficient of a material of the sealing layer.

Figure 1:
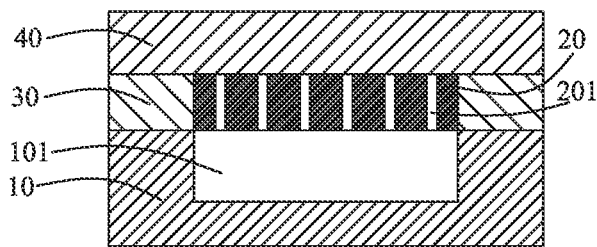
FIG. 1 is a structure of a MEMS device in related art.

Reference numerals in figures are illustrated as follows: 10—sacrificial layer; 101—cavity; 20—thin film; 201—through hole; 30—structural layer; 40—sealing layer; 1—sacrificial layer; 11—cavity; 2—thin film; 21—through hole; 3—structural layer; 31—hollow portion; 32—step structure; 4—sealing layer; 41—first sealing portion; 42—second sealing portion; 43—connection portion.

The accompanying drawings which are incorporated in and constitute a part of the specification illustrate embodiments consistent with the disclosure and together with the description serve to explain the principles of the disclosure.

DETAILED DESCRIPTION OF THE EMBODIMENTS

To better understand technical solutions of the disclosure, embodiments of the disclosure are described in detail below with reference to the accompanying drawings.

It is to be noted that the described embodiments are only part of embodiments and not all embodiments of the disclosure. Based on the embodiments in the disclosure, all other embodiments obtained without creative effort by those of ordinary skill in the art fall within the scope of protection of the disclosure.

Terms used in embodiments of the disclosure are for the purpose of describing specific embodiments only and are not intended to limit the disclosure. Singular forms "an", "said", and "the" as used in embodiments of the disclosure and in the appended claims are also intended to include a plurality of forms, unless the context clearly dictates otherwise.

It can be understood that the term "and/or" used herein is merely an association relationship that describes an associated object, indicating that there can be three relationships. For example, the expression "A and/or B" may include three cases: A exists alone, A and B exist at the same time, and B exists alone. In addition, the character "/" herein generally indicates that related objects are a kind of "or" relationship.

It is to be noted that the orientation words "up", "down", "left", "right", and the like described in the embodiments of the disclosure are described from the angles shown in the drawings and should not be understood as limiting the embodiments of the disclosure. Furthermore, in the context, it is to be understood that when a component is referred to as being connected "above/up" or "below/lower" of another component, the component can not only be directly connected to the "above/up" or "below/lower" of the another component, but can also be indirectly connected to the "above/up" or "below/lower" of the another component through a middle component.

Micro-electro-mechanical system (MEMS) refers to a high-tech device with a size of several millimeters or even smaller, and a size of an internal structure of this device is generally on the micron scale or even nanometer scale. The MEMS device generally includes suspended structures, which are fabricated by a sacrificial layer removal process.

Referring to FIG. 1, the MEMS device is manufactured by a method in the related art. At first, part of a material in a sacrificial layer 10 is removed by an etching process, and a cavity 101 is defined in the sacrificial layer 10. A thin film 20 is deposited on a top of the cavity 101, and a part of the thin film 20 is removed by an etching process to define at least one through hole 201. Thereafter, gas in the cavity 101 is discharged from the at least one through hole 201, and the at least one through hole 201 is sealed by a sealing layer 40 to complete sealing of the cavity 101. A structural layer 30 is deposited on a side of the sacrificial layer 10 where the cavity 101 is defined, and the thin film 20 is disposed in the structural layer 30. A thickness of the structural layer 30 is the same as that of the thin film 20. After the through hole 201 is sealed, the MEMS device is subjected to a chemical mechanical polishing (CMP) process. After research, the applicant found that the sealing cannot be realized immediately after the gas of the cavity 101 is exhausted by the manufacturing method in the related art, thereby resulting in a relatively long production period. Moreover, the manufacturing method in the related art requires the CMP process, which may easily lead to structural defects (such as holes, cracks, or delamination). Furthermore, in the manufacturing method in the related art, the thin film 20 is made of silicon-based materials, which may easily lead to structural defects (e.g., cracks and delamination) of the thin film 20 due to different thermal expansion coefficients from other materials.

To solve at least one of above technical problems, embodiments of the disclosure provide a method for manufacturing a MEMS device. Referring to the flow chart shown in FIG. 2 and structural changes of the MEMS device shown in FIG. 3-FIG. 6 during machining, the method begins at S1.

At S1, a thin film 2 is deposited on at least a part of a surface of a sacrificial layer 1.

At S3: at least one through hole 21 is defined in the thin film 2 by machining.

At S4: at least a part of a material in the sacrificial layer 1 covered by the thin film 2 is removed, and the part of the material removed from the sacrificial layer 1 is discharged from the at least one through hole 21 to define a cavity 11 in the sacrificial layer 1.

At S5: a sealing layer 4 is deposited on a surface of the thin film 2 facing away from the sacrificial layer 1 to seal the at least one through hole 21.

Figure 3:
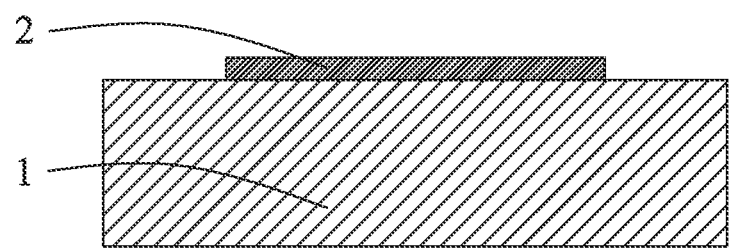
FIG. 3 is a schematic view of a structure of the MEMS device corresponding to operations at S1.
Figure 5:
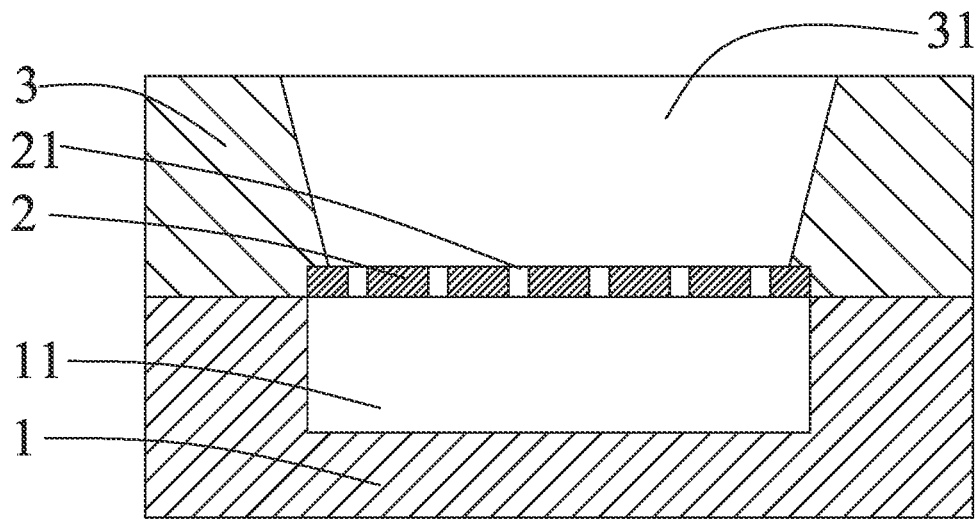
FIG. 5 is a schematic view of a structure of the MEMS device corresponding to operations at S4.
Figure 6:
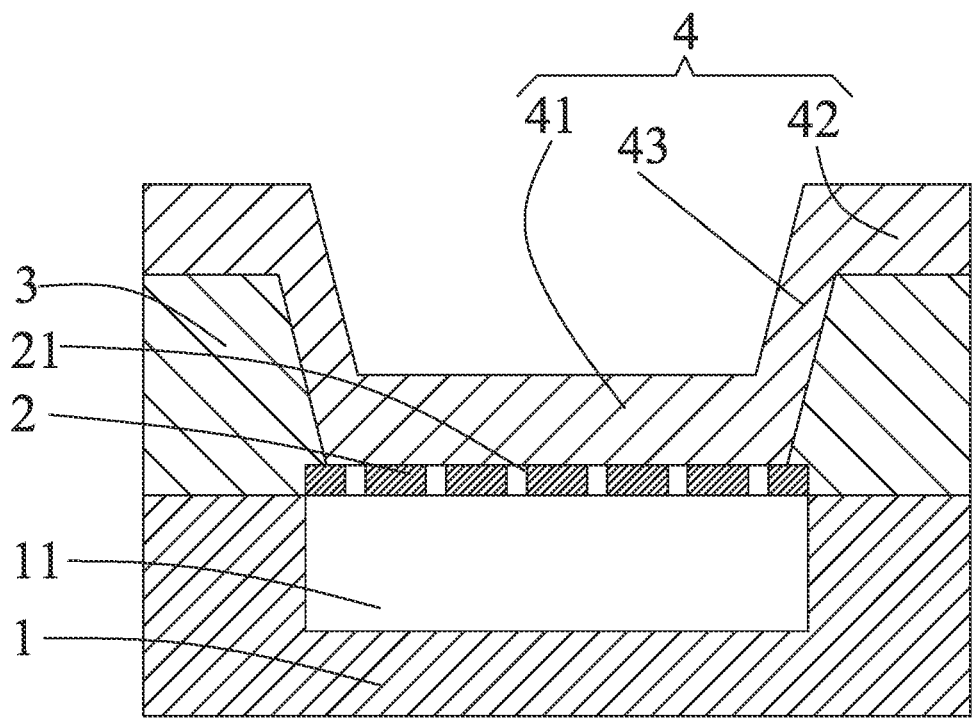
FIG. 6 is a schematic view of a structure of the MEMS device corresponding to operations at S5.

In embodiments, as illustrated in FIG. 3, the thin film 2 is first deposited on the surface of the sacrificial layer 1. Thereafter, referring to FIG. 4, the at least one through hole 21 is defined in the thin film 2 by machining. Referring to FIG. 5, at least part of the material covered by the thin film 2 in the sacrificial layer 1 is removed, and the part of the material removed from the sacrificial layer 1 is discharged from the at least one through hole 21 to form the cavity 11 in the sacrificial layer 1. Referring to FIG. 6, the sealing layer 4 is deposited on the surface of the thin film 2 facing away from the sacrificial layer 1 to seal the at least one through hole 21, thereby completing the sealing of the cavity 11. Compared with the manufacturing method in the related art, with the manufacturing method of the embodiments of the disclosure, only one layer of thin film 2 needs to be deposited, such that the manufacturing period is shortened and the sealing is relatively reliable.

Figure 2:
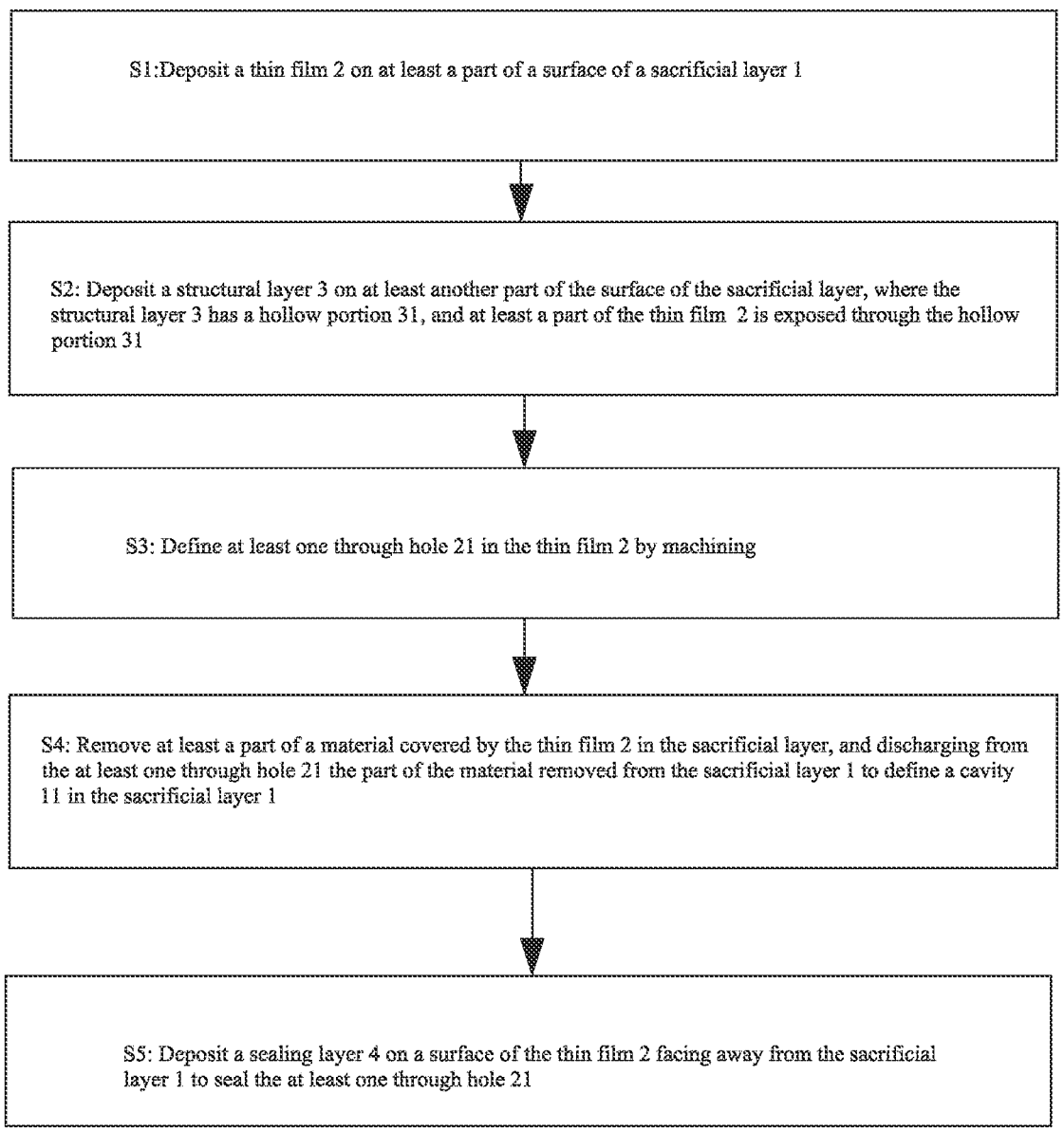
FIG. 2 is a flow chat of a method for manufacturing a MEMS device according to embodiments of the disclosure.

Specifically, as shown in FIG. 2, before operations at S3 are performed (i.e., before the at least one through hole 21 is defined in the thin film 2 by machining), operations at S2 can be further performed.

Figure 7:
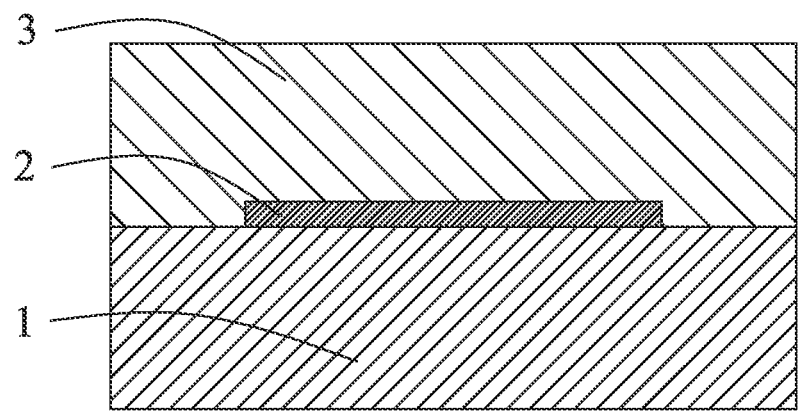
FIG. 7 is a schematic view of a structure of the MEMS device corresponding to operations at S2 in which a structural layer does not have a hollow portion.
Figure 8:
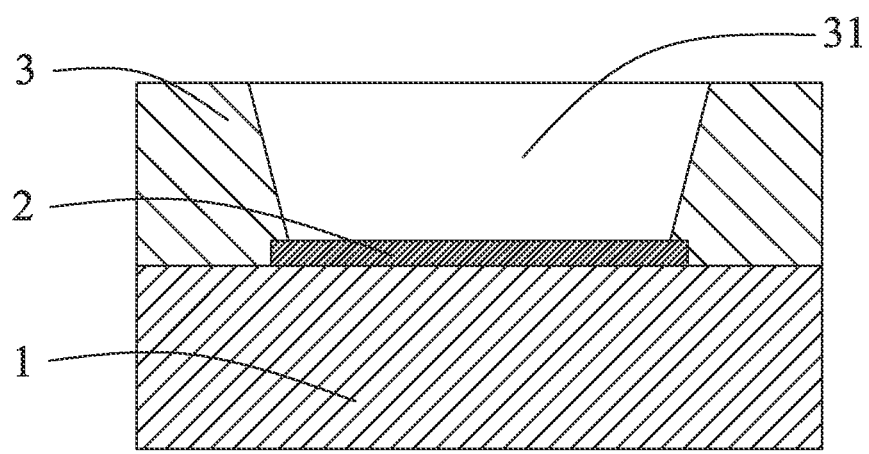
FIG. 8 is a schematic view of a structure of the MEMS device corresponding to operations at S2 in which the structural layer has a hollow portion.

In embodiments of the disclosure, with reference to FIG. 7, a structural layer 3 is deposited on at least another part of the surface of the sacrificial layer 1. Referring to FIG. 8, the structural layer 3 has at least one hollow portion 31, and at least a part of the thin film 2 is exposed through the hollow portion 31, so that the at least one through hole 21 is conveniently machined in the thin film 2 at S3.

In one example, a plurality of structural layers 3 may be deposited on the surface of the sacrificial layer 1, and there is a spacing between each two adjacent structural layers 3 to form a hollow portion 31. Alternatively, a structural layer 3 is formed on the sacrificial layer 1, and the hollow portion 31 may be formed by removing a part of a material of the structural layer 3. Specifically, the part of the material of the structural layer 3 may be removed by using a gas etching process, so as to form the hollow portion 31.

In one example, the structural layer 3 may be made from a silicon oxide, a metal oxide, a polymer, or a material whose thermal expansion coefficient is close to a thermal expansion coefficient of the silicon oxide. When the thermal expansion coefficient of the material of the structural layer 3 is close to that of the thin film 2, and/or when the thermal expansion coefficient of the material of the structural layer 3 is close to that of the sealing layer 4, material defects (such as holes, cracks, or delamination) due to a relatively large difference between the thermal expansion coefficients are not easily generated, thereby avoiding reducing the possibility of sealing failure, such that the manufactured MEMS device has a high operating reliability and high service life. In addition, in the manufacturing method of the embodiments of the disclosure, the manufacturing process of the structural layer 3 is expanded and manufacturing limitation of the MEMS device is reduced.

The silicon oxide may include silicon dioxide (e.g., SiO2), tetraethyl orthosilicate (TEOS), or polysilicon (Poly-Si). The polymer may include polyimide, silicon on glass, or Poly-p-xylene (p-xylene). The metal oxide may include aluminum oxide (e.g., Al2O3), or titanium dioxide (TiO2), or the like.

More specifically, in embodiments of the disclosure, operations at S2 further include an operation at S2.1. Referring to FIGS. 7-8, after the structural layer 3 is deposited on at least the another part of the surface of the sacrificial layer 1, at least a part of a material covering the thin film 2 in the structural layer 3 is removed to form the hollow portion 31.

In embodiments of the disclosure, as shown in FIGS. 7-8, the structural layer 3 is deposited on at least another part of the surface of the sacrificial layer 1, and the structural layer 3 may also cover the thin film 2, and therefore, at least the part of the material covering the thin film 2 in the structural layer 3 is removed to form the hollow portion 31, so that at least the part of the material of the thin film 2 is exposed through the hollow portion 31, which facilitates preformation of operations at S3 (i.e., the at least one through hole 21 is defined in the thin film 2 by machining).

Figure 9:
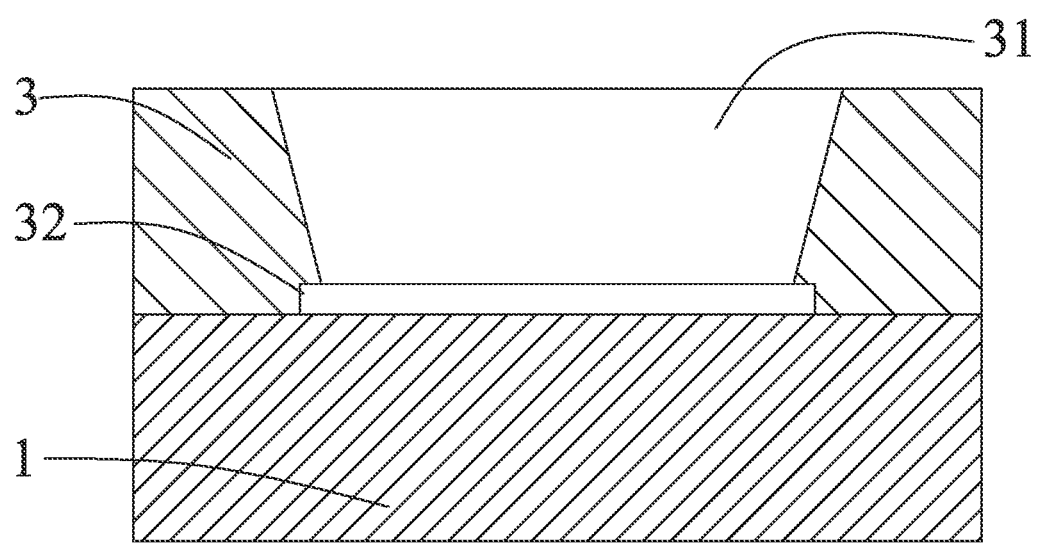
FIG. 9 is a schematic view of a structure of the MEMS device corresponding to operations at S2 in which a thin film is not shown.

In one embodiment, referring to FIGS. 8-9, the part of the material covering the thin film 2 in the structural layer 3 is removed so that the structural layer 3 has a step structure 32, and an edge of the thin film 2 is disposed in the step structure 32, so that the edge of the thin film 2 is hold down by the structural layer 3, thereby reducing the possibility of detaching of the thin film 2 through the hollow portion 31.

In another embodiment (not shown in the figure), all the material covering the thin film 2 in the structural layer 3 is removed to form the hollow portion 31. In this case, there is no step structure 32 in the structural layer 3 and the structural layer 3 does not hold down the edge of the thin film 2.

In above embodiments, a material of the thin film 2 is one of a silicon-based material, a polymer material, or a metal material.

The silicon-based material may include silicon dioxide (e.g., SiO2), silicon nitride (e.g., $Si_3N_4$), TEOS, Poly-Si, or amorphous silicon (a-Si). The polymer material may include polyimide, silicon on glass, or p-xylene. The metal material may include aluminum oxide (e.g., Al2O3), titanium nitride (TiN), tantalum nitride (TaN), or titanium dioxide (TiO2).

Based on above materials of the thin film 2, the thin film 2 can be made of a material having a thermal expansion coefficient close to the thermal expansion coefficient of the structural layer 3. Alternatively, the thin film 2 can be made of a material having a thermal expansion coefficient close to that of the sealing layer 4, so that material defects (such as holes, cracks, or delamination) due to a relatively large difference between thermal expansion coefficient may not be easy to occur, thereby avoiding reduction of the possibility of sealing failure, such that the manufactured MEMS device has a relatively high operating reliability and high service life. In addition, compared with the method in the related art which uses silicon-based materials, in the manufacturing method of the embodiments of the disclosure, the manufacturing material of the thin film 2 is expanded, a processing method that can process the through hole 21 is expanded, and manufacturing limitation of the MEMS device is reduced.

When the thin film 2 is made of the silicon-based material, the through hole 21 can be made by a dry etching process. When the thin film 2 is made of the polymer material, the through hole 21 can be made by a photolithography or laser process. When the thin film 2 is made of the metal material, the through hole 21 can be made by a wet etching process.

In addition, when the thin film 2 is made of the metal material, the through hole 21 of the thin film 2 can withstand a relatively high temperature while being sealed by the sealing layer 4, such that defect or delamination is not easy to occur, and therefore the operation reliability and service life of the MEMS device are relatively high.

Figure 4:
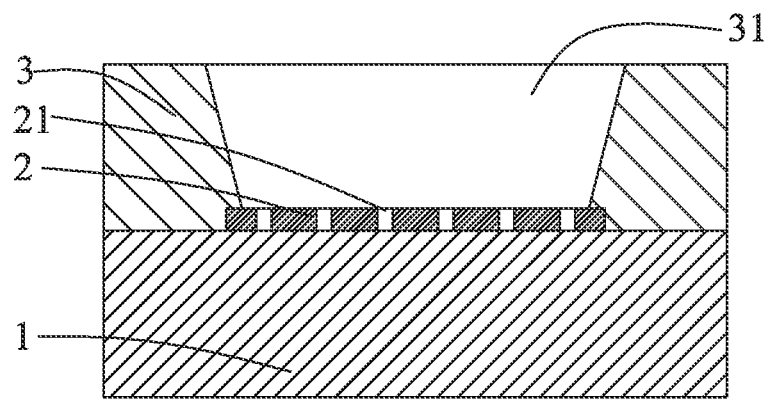
FIG. 4 is a schematic view of a structure of the MEMS device corresponding to operations at S3.

In above embodiments, referring to FIG. 3 to FIG. 4, in operations at S3, the at least one through hole 21 is machined in the thin film 2 by laser drilling or surface ablation.

In embodiments, referring to FIG. 3 to FIG. 4, the at least one through hole 21 is machined in the thin film 2 by the laser drilling or surface ablation, a diameter of each through hole 21 is within a sub-micron range or a nanometer range, so that when the through hole 21 is sealed by the sealing layer 4, material defects (holes and cracks) and delamination of the sealing layer 4 and the thin film 2 are not easy to occur, and the manufactured MEMS device has a relatively high operating reliability and long service life.

In embodiments of the disclosure, a size of the through hole 21 can be adjusted according to an area or a depth of the material to be removed in the sacrificial layer 1, to control a time length for which the material to be removed in the sacrificial layer 1 is discharged from the at least one through hole 21, such that a production process is relatively flexible, and usage needs of different users can be met.

In above embodiments, the MEMS device is fabricated by completing above-mentioned operations in a vacuum environment, thereby drying moisture and/or organic gas in the cavity 11, so as to keep operating performance of the MEMS device at a stable level and improve the operating reliability of the MEMS device and prolong service life of the MEMS device.

In above embodiments, the manufacturing method of the embodiments of disclosure does not need to carry out the CMP process on the MEMS device, such that defects (such as holes, cracks, or delamination) due to the oxide material may not be easy to be generated, the operating reliability of the MEMS device is improved, and the service life of the MEMS device is prolonged.

The manufacturing method in embodiments of the disclosure may be compatible with a CMOS process, and may be easy to integrate with silicon-based fabrication process, thereby helping to shorten the production period.

According to a second aspect of the disclosure, a MEMS device is provided. Referring to FIG. 6, the MEMS device is prepared by the foregoing method for manufacturing the MEMS device. The MEMS device includes a sacrificial layer 1, a thin film 2, a structural layer 3, and a sealing layer 4. The sacrificial layer 1 defines a cavity 11, and the thin film 2 is arranged on a side of the sacrificial layer 1 defining the cavity 11 and covers the cavity 11. The thin film 2 defines at least one through hole 21, and each through hole 21 communicates with the cavity 11. The structural layer 3 is provided on the side of the sacrificial layer 1 where the cavity 11 is defined. The sealing layer 4 includes a first sealing portion 41. The first sealing portion 41 is arranged on a side of the thin film 2 facing away from the sacrificial layer 1, and the first sealing portion 41 covers and blocks (closes) the at least one through hole 21. The MEMS device provided in embodiments of the disclosure is fabricated by the manufacturing method described above and has effects described above, which are not described here.

Specifically, as shown in FIG. 6, the structural layer 3 has at least one hollow portion 31, and the hollow portion 31 is adjacent to the side of the thin film 2 facing away from the sacrificial layer 1. The first sealing portion 41 is filled in at least a part of a space of the hollow portion 31 for sealing the at least one through hole 21 of the thin film 2, thereby completing the sealing of the cavity 11.

In one embodiment, referring to FIG. 6, the first sealing portion 41 can fill a part of the space of the hollow portion 31. In another embodiment (not shown), the first sealing portion 41 may fill all the space of the hollow portion 31.

More specifically, as shown in FIG. 6, the sealing layer 4 further includes a second sealing portion 42. The second sealing portion 42 is disposed on a side of the structural layer 3 facing away from the sacrificial layer 1. The first sealing portion 41 and the second sealing portion 42 are connected through a connection portion 43. The connection portion 43 and the first sealing portion 41 cooperatively form a recessed portion.

In this embodiment, as shown in FIG. 6, the second sealing portion 42 is configured to isolate the structural layer 3 from other parts, thereby ensuring the operating performance of the structural layer 3.

Referring to FIG. 6, a thickness of the structural layer 3 is larger than a thickness of the thin film 2, the thickness of the structural layer 3 is on the micron scale, and the thickness of the thin film 2 is on the nanometer scale. When the thickness of the thin film 2 is on the micron scale, it is convenient to observe a formation process of the cavity 11 in the sacrificial layer 1 and whether an interior of the cavity 11 is clean or not.

The foregoing merely describes some embodiments of the disclosure. It is to be noted that improvements may be made to those of ordinary skill in the art without departing from the inventive idea of the disclosure, but these are within the scope of protection of the disclosure.

What is claimed is:

1. A method for manufacturing a MEMS device, comprising:
depositing a thin film on at least a part of a surface of a sacrificial layer;
depositing a structural layer on the surface of the sacrificial layer, wherein the structural layer has a hollow portion, and at least a part of the thin film is exposed through the hollow portion;
defining at least one through hole in the thin film by machining;
removing at least a part of a material covered by the thin film in the sacrificial layer, and discharging from the at least one through hole the part of the material removed from the sacrificial layer to define a cavity in the sacrificial layer; and
depositing a sealing layer on a surface of the thin film facing away from the sacrificial layer to seal the at least one through hole.

2. The method of claim 1, wherein the structural layer has a step structure, and an edge of the thin film is hold down by the step structure.

3. The method of claim 1, further comprising:
after depositing the structural layer on the surface of the sacrificial layer,
removing at least a part of a material covering the thin film in the structural layer to form the hollow portion.

4. The method of claim 1, wherein the thin film is made from one of a silicon-based material, a polymer material, or a metal material.

5. The method of claim 4, wherein the silicon-based material comprises silicon dioxide, silicon nitride, tetraethyl orthosilicate, polysilicon, or amorphous silicon.

6. The method of claim 1, wherein the at least one through hole is defined in the thin film by laser drilling or surface ablation.

7. The method of claim 1, wherein the method is performed in a vacuum environment.

* * * * *